United States Patent
Satoh

(10) Patent No.: US 9,112,051 B1
(45) Date of Patent: Aug. 18, 2015

(54) THREE-DIMENSIONAL FLASH MEMORY DEVICE

(71) Applicant: Avalanche Technology, Inc., Fremont, CA (US)

(72) Inventor: Kimihiro Satoh, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/451,252

(22) Filed: Aug. 4, 2014

(51) Int. Cl.
*H01L 29/792* (2006.01)
*H01L 21/822* (2006.01)
*H01L 29/66* (2006.01)
*H01L 27/115* (2006.01)
*H01L 21/28* (2006.01)

(52) U.S. Cl.
CPC ...... *H01L 21/8221* (2013.01); *H01L 21/28282* (2013.01); *H01L 27/11563* (2013.01); *H01L 29/66833* (2013.01)

(58) Field of Classification Search
CPC ............... H01L 21/8221; H01L 29/66833; H01L 27/11563; H01L 21/28282
See application file for complete search history.

(56) References Cited

U.S. PATENT DOCUMENTS

| | | |
|---|---|---|
| 8,295,089 B2 | 10/2012 | Jeong et al. |
| 8,385,122 B2 | 2/2013 | Kim et al. |
| 8,723,281 B2 | 5/2014 | Satoh et al. |

*Primary Examiner* — Long Pham
(74) *Attorney, Agent, or Firm* — Bing K. Yen

(57) ABSTRACT

The present invention is directed to a memory device comprising a semiconductor block formed on a p-type semiconductor substrate with the semiconductor block having i number of n-type line regions extending along a first direction separated by i−1 number of p-type line regions along a second direction substantially perpendicular to the first direction; and a plurality of paired gate electrodes extending along the second direction with each pair of the paired gate electrodes formed adjacent to two opposite sides of the semiconductor block with a charge-trapping layer interposed therebetween, where i is an integer greater than or equal to two. The n-type line regions may function as sub-bit lines or sub-source lines or both. The p-type line regions may function as channel lines that allow current to flow vertically between two n-type line regions adjacent thereto. The memory device may further include a bit or source select unit.

8 Claims, 16 Drawing Sheets

US 9,112,051 B1

THREE-DIMENSIONAL FLASH MEMORY DEVICE

BACKGROUND

The present invention relates to a semiconductor memory device, and more particularly to a three-dimensional flash memory device.

A semiconductor memory device may be either volatile or non-volatile, depending on the type of memory element and the memory architecture employed. An example of volatile memory device is dynamic random access memory (DRAM), which loses its stored information when power is interrupted or lost. Non-volatile memory device, such as NAND or NOR memory device, can retain stored information when powered off.

A semiconductor memory device normally comprises an array of memory cells. To be cost competitive, a small memory cell size is desired in order to increase device density on wafers. One way to reduce the memory cell size is to use a compact cell structure. The cell size of current NAND devices is about 4 $F^2$, where F is the minimum feature size associated with a particular manufacturing technology. Since the minimum cell size for an array of two-dimensional cells is 4 $F^2$, further decrease in the cell size of NAND devices would require the stacking of memory cells in the vertical direction, thereby forming three-dimensional NAND memory structures.

Information relevant to attempts to address problems associated with three-dimensional NAND devices can be found in U.S. Pat. Nos. 8,295,089 and 8,385,122. However, each one of these references suffers from one or more of the following disadvantages: multiple masking steps are required to form multiple gate contacts; word lines shared by multiple cells in the bit line direction need much larger charge pump than a two-dimensional planar device; and complicated etching steps for forming channel studs.

For the foregoing reasons, there is a need for a memory device that has a small cell size and that can be inexpensively manufactured.

SUMMARY

The present invention is directed to a semiconductor memory device that satisfies this need. A memory device having features of the present invention comprises a semiconductor column formed on a p-type semiconductor substrate with the semiconductor column having i number of n-type regions separated by i−1 number of p-type regions along a vertical direction; and a pair of gate electrodes formed adjacent to two opposite sides of the semiconductor column with a charge-trapping layer interposed therebetween, where i is an integer greater than or equal to two.

According to another aspect of the present invention, a semiconductor memory device comprises a semiconductor block formed on a p-type semiconductor substrate with the semiconductor block having i number of n-type line regions extending along a first direction separated by i−1 number of p-type line regions along a second direction substantially perpendicular to the first direction; and a plurality of paired gate electrodes extending along the second direction with each pair of the paired gate electrodes formed adjacent to two opposite sides of the semiconductor block with a charge-trapping layer interposed therebetween, where i is an integer greater than or equal to two. The n-type line regions may function as sub-bit lines or sub-source lines or both. The p-type line regions may function as channel lines that allow current to flow along the second direction between two n-type line regions adjacent thereto. The memory device may further include a bit select unit or a source select unit or both coupled to the semiconductor block.

The bit select unit comprises a bit terminal extending along the second direction; i or i−1 number of bit leads coupled to the bit terminal; and i or i−1 number of parallel pairs of bit select transistors with each pair of the bit select transistors being coupled to one of the n-type line regions at one end and one of the bit leads at the other end. Each pair of the bit select transistors includes a paired gate electrodes extending along the second direction. The source select unit comprises a source stud extending along the second direction; i or i−1 number of source leads coupled to the source stud; and i or i−1 number of parallel pairs of source select transistors with each pair of the source select transistors being coupled to one of the n-type line regions at one end and one of the source leads at the other end. Each pair of the source select transistors includes a paired gate electrodes extending along the second direction.

According to still another aspect of the present invention, a semiconductor memory device comprises a plurality of parallel semiconductor blocks separated along a first direction on a p-type semiconductor substrate with each of the semiconductor blocks having i number of n-type line regions extending along a second direction separated by i−1 number of p-type line regions along a third direction; a plurality of first plate electrodes separated along the second direction with each of the first plate electrodes being perforated by the semiconductor blocks extending along the second direction; and a charge-trapping layer formed between the semiconductor blocks and the plate electrodes, where i is an integer greater than or equal to two. The first, second, and third directions are orthogonal to each other. Each of the first plate electrodes has a portion formed above the semiconductor blocks that functions as a word line and portions formed between the semiconductor blocks that function as control gates.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features, including method steps, of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 1:
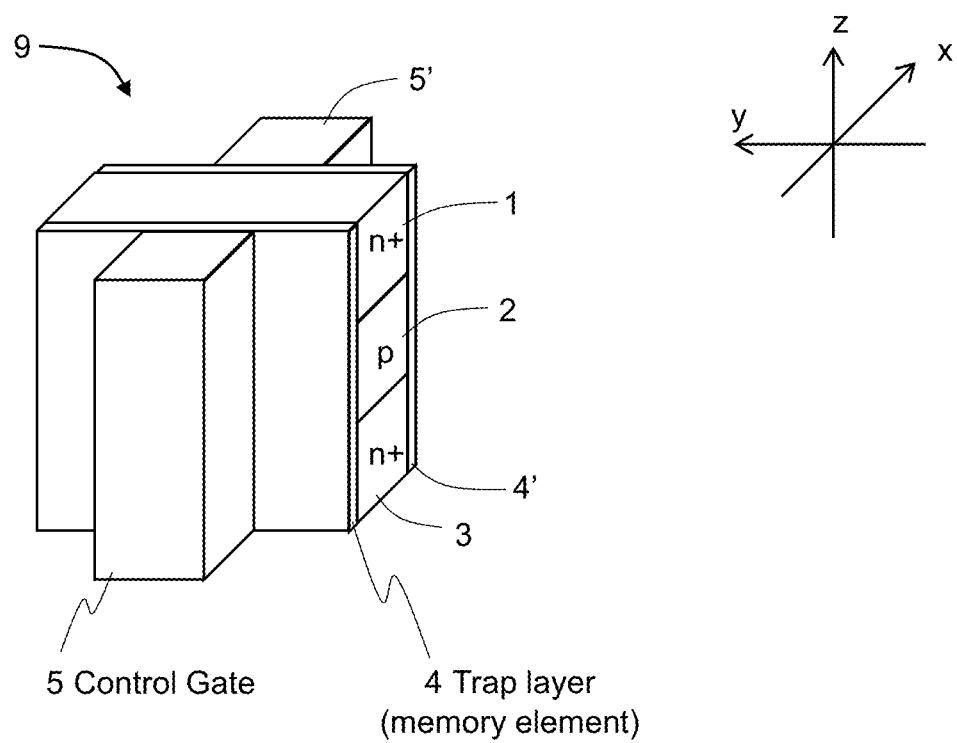
FIG. 1 is a perspective view of a memory cell embodying features of the present invention.

An embodiment of the present invention as applied to a memory cell will now be described with reference to FIG. 1. Referring now to FIG. 1, the illustrated memory cell 9 comprises a semiconductor column having an upper n+ region 1 and a lower n+ region 3 with a p region 2 interposed therebetween; a first and second control gates 5 and 5' formed on opposite sides of the semiconductor column with a first and second charge-trapping layers 4 and 4' interposed therebetween, respectively. The semiconductor column can be made of any semiconductor material, such as but not limited to silicon (Si), silicon-germanium (SiGe), II-VI semiconductor compounds, or III-V semiconductor compounds. The upper and lower n+ regions 1 and 3 can be operated as a drain and source, respectively. The charge-trapping layers 4 and 4' can be made of any suitable layer stack, such as but not limited to silicon oxide/silicon nitride/silicon oxide (ONO) or aluminum oxide/silicon nitride/silicon oxide (ANO). The first and second control gates 5 and 5' extending along the vertical direction (z-direction) can be made of doped silicon or any suitable conductor, such as but not limited to titanium (Ti), tungsten (W), tantalum (Ta), niobium (Nb), titanium nitride (TiN), tantalum nitride (TaN), niobium nitride (NbN), or any combination thereof.

Figure 2B:
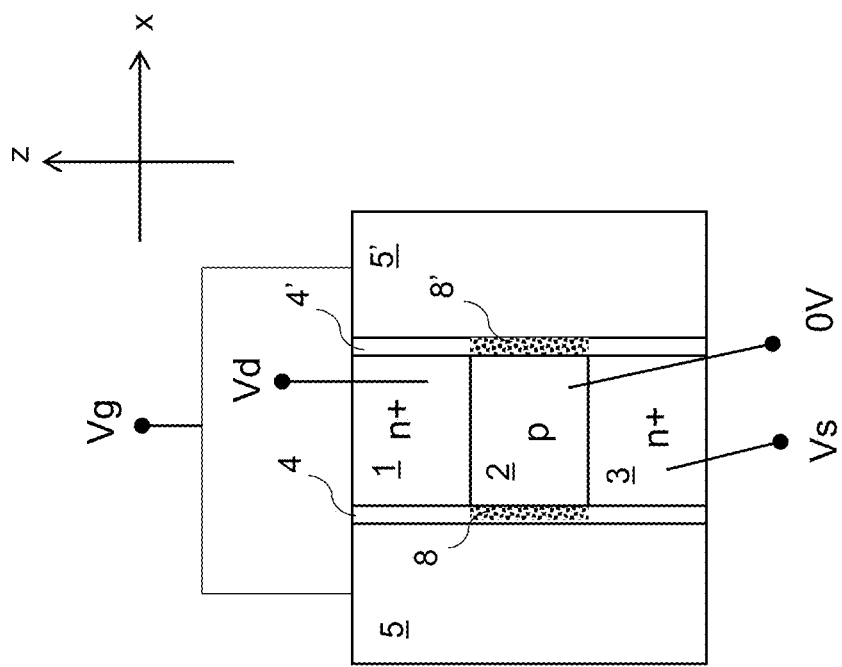
FIGS. 2A and 2B are cross sectional views illustrating operation of the memory device of FIG. 1 according to embodiments of the present invention.
Figure 2A:
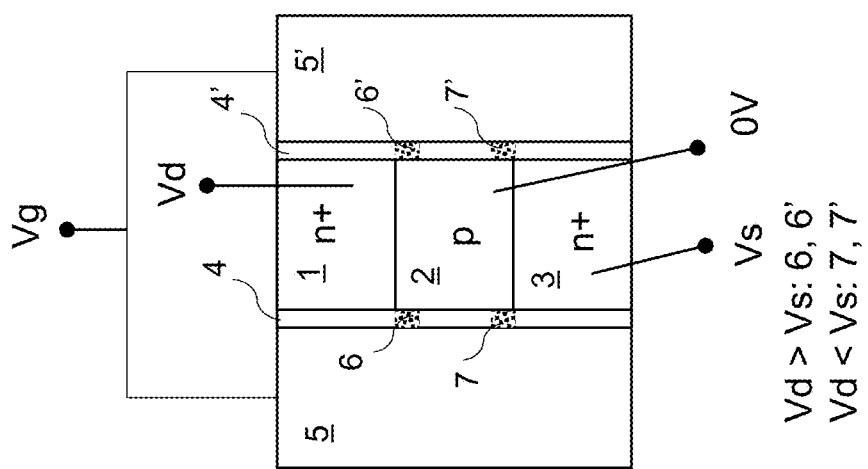

FIGS. 2A and 2B are cross sectional views of the memory cell 9 of FIG. 1 illustrating operation of the same cell. Read and program operations are carried out by applying voltages Vd, Vs, and Vg to the upper n+ region 1, the lower n+ region 3, and the control gates 5 and 5', respectively. The p region 2 operates as a channel region and is normally grounded during operation. Vd and Vs are greater than or equal to zero. When a sufficient voltage Vg that is higher than a threshold voltage Vt is applied to the control gates 5 and 5', vertical n-channels are formed on two sides of the p region 2 adjacent to the charge-trapping layers 4 and 4' are formed, thereby allowing current to flow vertically between the two n+ regions 1 and 3.

The charge-trapping layers 4 and 4' are made of the same material and may be programmed by either channel hot electron (CHE) injection or Fowler-Nordheim (FN) tunneling injection. CHE injection allows electrons to be trapped in each of the two charge-trapping layers 4 and 4' at two regions near the upper and lower p/n junctions as illustrated in FIG. 2A. When Vd>Vs≥0 V, electrons are injected into the charge-trapping layers 4 and 4' near the upper p/n junction at regions 6 and 6'. When Vs>Vd≥0 V, electrons are injected into the charge-trapping layers 4 and 4' near the lower p/n junction at regions 7 and 7'. Accordingly, the memory cell 9 programmed by CHE injection may store two bits of data. Moreover, if the two control gates 5 and 5' can be independently operated, then the memory cell 9 may store four bits of data.

Hot hole injection may be used to erase data. To erase the data stored in the upper regions 6 and 6', the conditions of Vd>0, Vs≈0, and Vg<0 are applied to the upper n+ region 1, the lower n+ region 3, and the control gates 5 and 5', respectively. To erase the data stored in the lower regions 7 and 7', the conditions of Vd≈0, Vs>0, and Vg<0 are applied to the upper n+ region 1, the lower n+ region 3, and the control gates 5 and 5', respectively. The p region 2 is grounded during both erase operations.

In contrast to CHE injection, FN tunneling injection captures electrons in the two charge-trapping layers 4 and 4' along the n-channels at regions 8 and 8' as illustrated in FIG. 2B. Unlike CHE injection that requires a relatively high current to operate, a relatively smaller current on the order of $10^{-6}$ A or less can trigger FN tunneling. Reverse FN tunneling may be used to erase data. For the reverse FN tunneling operation, the upper n+ region 1, the p region 2, and the lower n+ region 3 are electrically grounded, while a negative voltage is applied to the control gates 5 and 5'.

Figure 3:
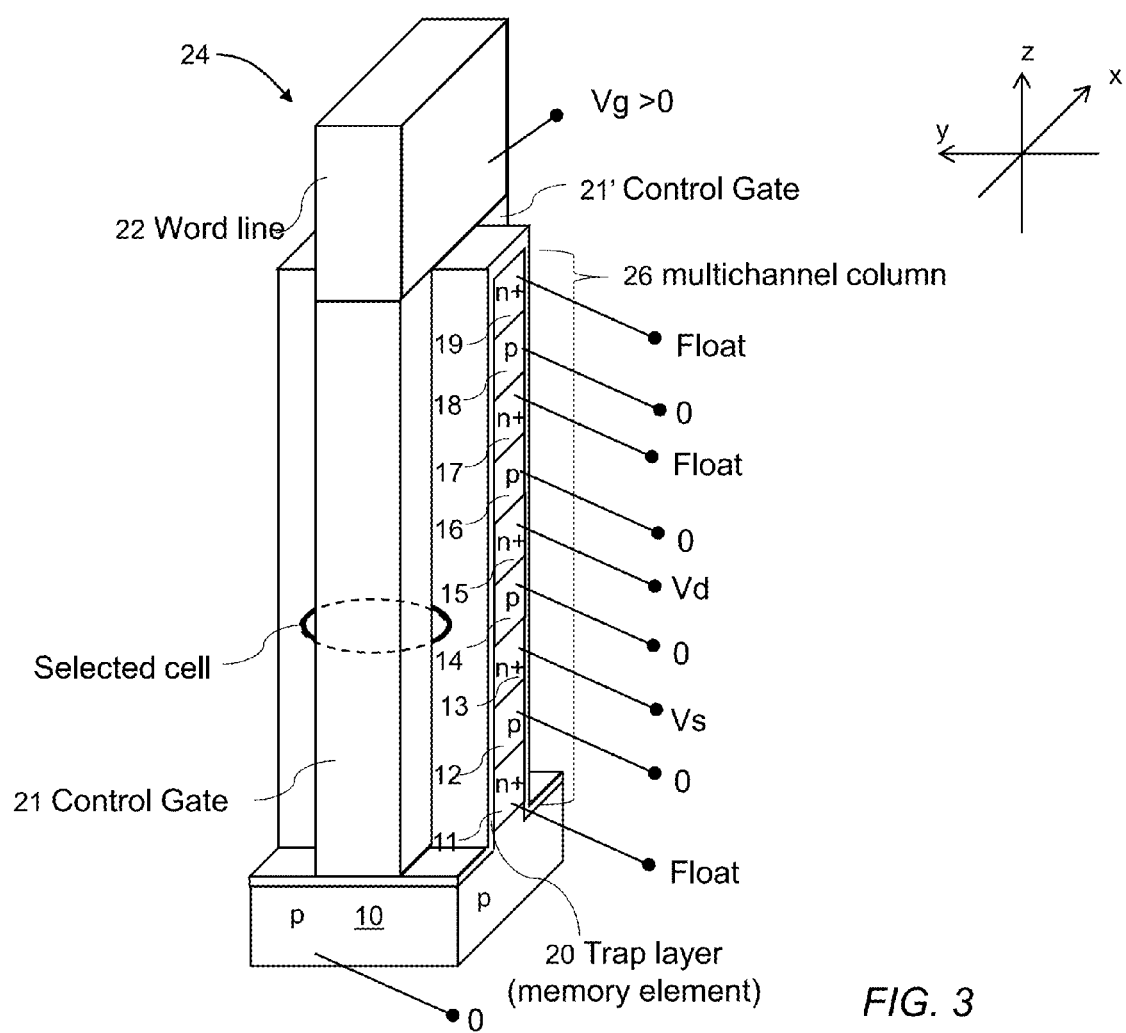
FIG. 3 is a perspective view of a memory column in accordance with an embodiment of the present invention.

FIG. 3 illustrates an exemplary memory column 24 in accordance with an embodiment of the present invention. The memory column 24, which is formed on a p-type semiconductor substrate 10, is formed by stacking multiple memory cells 9 in the vertical direction (z-direction). The memory column 24 includes a semiconductor column formed on a p-type substrate 10 with five n+ regions 11, 13, 15, 17, 19 interposed by four p regions 12, 14, 16, and 18 along the vertical direction; a first and second control gates 21 and 21' formed vertically on opposite sides of the semiconductor column with a charge-trapping layer 20 interposed therebetween; and a word line 22 formed above the semiconductor column and coupled to the first and second vertical control gates 21 and 21' therebeneath. The word line 22 extends along the x-direction. The five n+ regions 11, 13, 15, 17, 19 and the four p regions 12, 14, 16, and 18 collectively form a multi-channel column 26 with each of the four p regions 12, 14, 16, and 18 operates as an individual channel for a memory cell. Each of the middle n+ regions 13, 15, and 17 may operate as source or drain depending on the memory cell selected. For example, the n+ region 15 may operate as a lower n+ region (source) for a memory cell that includes the p region 16 or as an upper n+ region (drain) for another memory cell that includes the p region 14. While the exemplary memory column 24 illustrated in FIG. 3 includes four memory cells for illustration purpose, the present invention allows any number of memory cells 9 to be stacked in the vertical direction (z-direction). Accordingly, a memory column with i number of memory cells would include i+1 number of n+ regions interposed by i number of p regions.

Operation of the memory column 24 will now be described with continuing reference to FIG. 3. All p regions 12, 14, 16, and 18 and the substrate 10 are grounded. A memory cell that includes the p region 14 is selected first by applying Vd and Vs to the upper n+ region 15 and the lower n+ regions 13, respectively, while leaving other n+ regions 11, 17 and 19 to float electrically. A positive gate voltage Vg is then applied to the word line 22 and the control gates 21 and 21' coupled thereto, thereby forming conductive channels on the two sides of the p regions 12, 14, 16, and 18 adjacent to the control gates 21 and 21'. Consequently, the n+ regions 17 and 19 above the upper n+ region 15 of the selected cell will have the same potential of Vd, while the n+ region 11 below the lower n+ region 13 of the selected cell have the same potential of Vs. Although conductive channels are formed in all memory cells of the memory column 24, current only flows through the pair of vertical channels of the selected cell owing to the potential difference between Vd and Vs applied to the upper n+ region 15 and the lower n+ regions 13, respectively. In conventional 2D or 3D NAND architecture, Vd and Vs are applied to a drain and a source disposed at two ends of a memory string, which includes multiple memory cells connected in series. Therefore, a relatively high drain or source potential is needed to operate a NAND memory string because of the accumulated resistance from individual memory cells coupled in series. The operating drain or source voltage increases with increasing number of memory cells in a NAND memory string. By contrast, the memory column 24 requires a much smaller potential difference between Vd and Vs to operate because current only passes through a selected memory cell, not the entire memory column. As such, the operating drain or source voltage of the memory column 24 is relatively low and is substantially independent of the number of memory cells.

Figure 4:
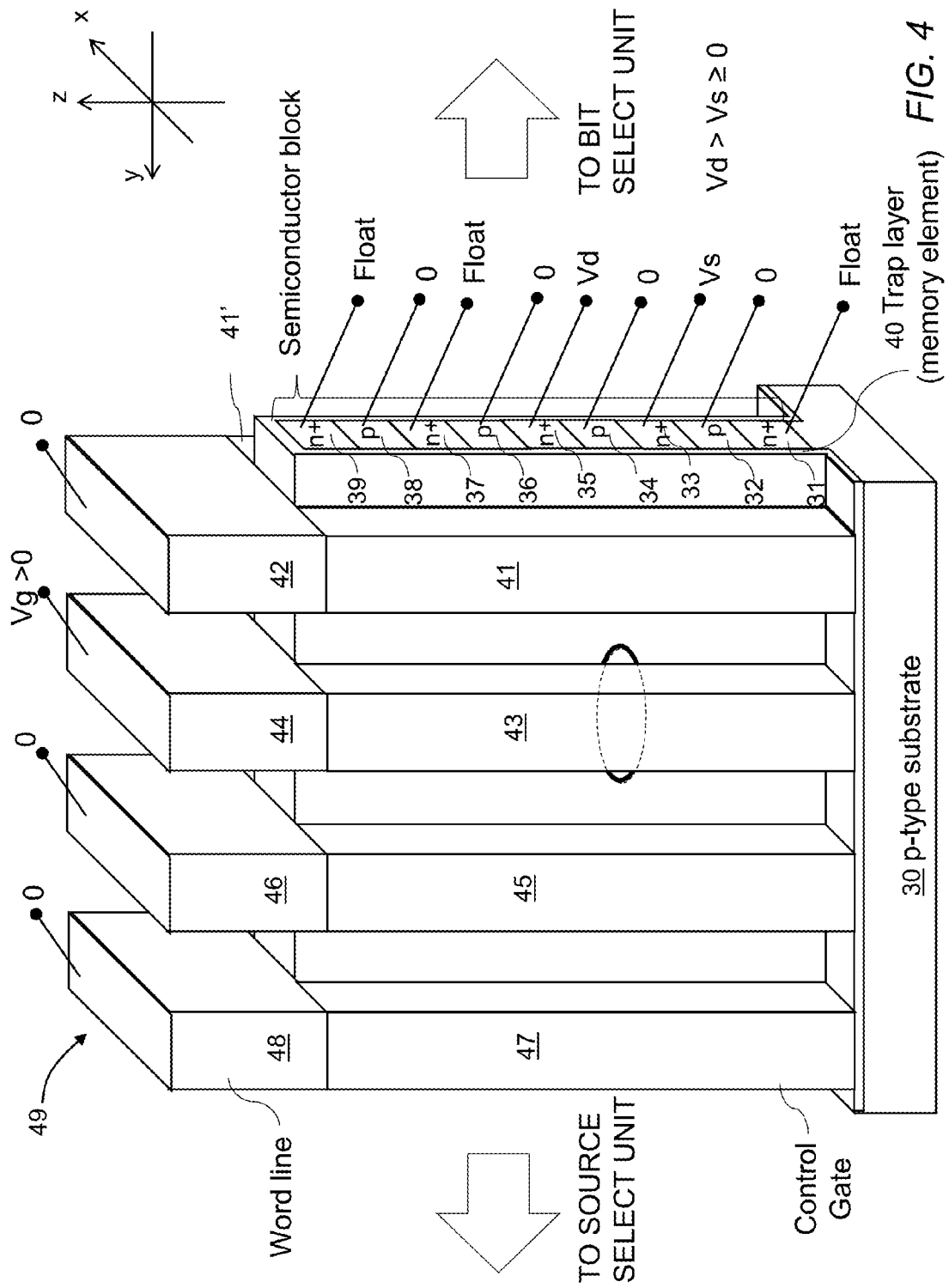
FIG. 4 is a perspective view of a 2D memory array in accordance with an embodiment of the present invention.

FIG. 4 shows that a plurality of memory columns 24 are coupled in the y-direction to form a two-dimensional (2D) array of memory cells 49, which comprises a semiconductor block extending along the y-direction and formed on a p-type semiconductor substrate 30 with a plurality of n+ line regions represented by 31, 33, 35, 37, and 39 and extending along the y-direction interposed by a plurality of p line regions represented by 32, 34, 36, and 38 along the vertical direction (z-direction); a plurality of paired control gates represented by 41/41', 43/43', 45/45', and 47/47' with each pair formed vertically on opposite sides of the semiconductor block with a charge-trapping layers 40 interposed therebetween; a plurality of word lines represented by 42, 44, 46, and 48 and formed above the semiconductor block with each coupled to a respective pair of the control gates 41/41', 43/43', 45/45', and 47/47' therebeneath. In addition to functioning as the source and drain of a selected memory cell, the n+ line regions 31, 33, 35, 37, and 39 function as sub-bit/source line for transmitting Vd and Vs to the drain and source, respectively.

Operation of the 2D array of memory cells 49 will now be described with continuing reference to FIG. 4. All p line regions 32, 34, 36, and 38 and the substrate 30 are grounded during operation. A memory cell that includes a channel region at the intersection between the p line region 34 and the gate electrodes 43/43' is selected first by applying Vd and Vs to the upper n+ line region 35 and the lower n+ line region 33, respectively, while leaving other n+ line regions 31, 37, and 39 to float electrically. A positive gate voltage Vg is then applied to the word line 44 and the control gates 43 and 43' coupled thereto, thereby forming conductive channels on the two sides of the p line regions 32, 34, 36, and 38 adjacent to the control gates 43 and 43'. Consequently, the n+ line regions 37 and 39 above the upper n+ line region 35 of the selected cell will have the same potential of Vd, while the n+ line region 31 below the lower n+ line region 33 have the same potential of Vs. Although conductive channels are formed in all memory cells between the control electrodes 43 and 43', current only flows through the pair of vertical channels of the selected cell owing to the potential difference between Vd and Vs applied to the upper n+ line region 35 and the lower n+ line region 33, respectively.

A memory cell in the 2D array 49 is selected by applying an appropriate gate voltage Vg to the word line 44 and by applying Vd and Vs to the upper and lower n+ line regions 35 and 33, respectively, with Vd being substantially higher than Vs. The selection of the upper n+ line region 35 and the application of Vd thereto is carried out by a bit select unit attached to one end of the 2D array of memory cells 49 along the y-direction. The selection of the lower n+ line region 33 and the application of Vs thereto is carried out by a source select unit attached to the other end of the 2D array of memory cells 49.

Figure 5:
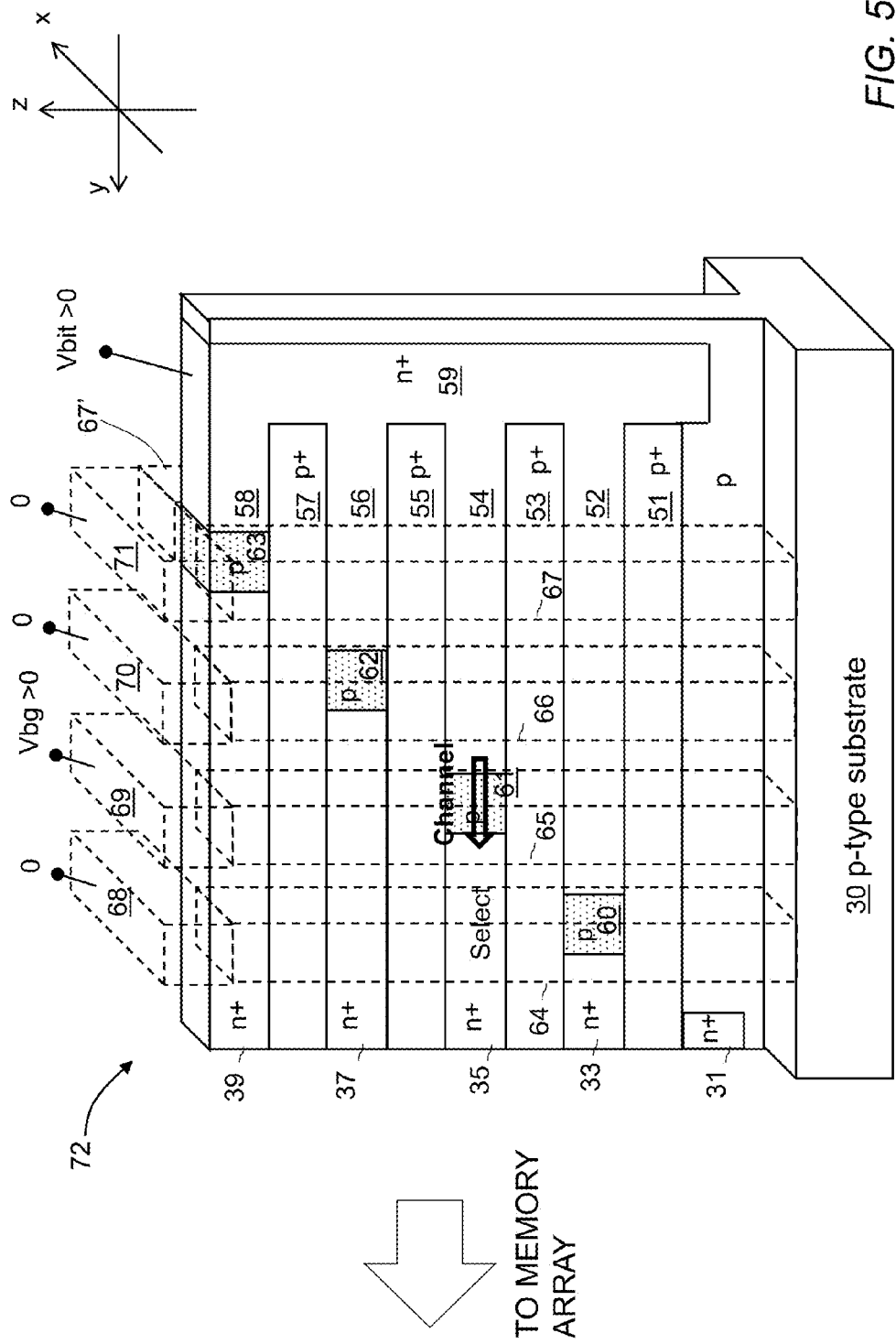
FIG. 5 is a perspective view of a bit select unit in accordance with an embodiment of the present invention.

FIG. 5 illustrates an exemplary bit select unit 72, which includes a bit terminal 59 and a plurality of horizontal bit leads 52, 54, 56, and 58 coupled thereto; and the horizontal n+ line regions 33, 35, 37, and 39 extending from the 2D array of memory cells 49 and connected to the bit leads 52, 54, 56, and 58 through a plurality of bit select transistors controlled by a plurality of paired bit select gates 64/64'-67/67' coupled to a plurality of bit select lines 68-71. The bit terminal 59 is connected to a bit line (not shown) above. For reasons of clarity, the bit select gates 64/64'-67/67' and the bit select lines 68-71 are made transparent in FIG. 5 to clearly illustrate the structure behind.

The bit select unit 72 comprises a semiconductor block formed on the p-type substrate 30 with a plurality of horizontal n+ line regions 52, 54, 56, and 58 functioned as bit leads and interposed by a plurality of p+ line regions 51, 53, 55, and 57 functioned as field line regions along the vertical direction (z-direction). The bit select unit 72 further includes a plurality of p regions 60-63 formed adjacent to the bit leads 52, 54, 56, and 58 and functioned as the channel regions for the bit select transistors; the plurality of paired vertical bit select gates 64/64'-67/67' formed adjacent to two opposite sides of p regions 60-63 with a gate dielectric layer (not shown) interposed therebetween; the plurality of bit select lines 68-71 formed above the semiconductor block with each one coupled to a respective pair of the paired bit select gates 64/64'-67/67'; and a vertical n+ line region 59 in the semiconductor block that functions as the bit terminal and couples to the bit leads 52, 54, 56, and 58. The n+ line regions 33, 35, 37, and 39 extending from the 2D array of memory cells 49 are coupled to the p regions 60-63, respectively. The p line regions 32, 34, 36, and 38 extending from the 2D array of memory cells 49 are coupled to the p+ line regions 51, 53, 55, and 57, respectively. The n+ line region 31 may not be connected to a bit lead or the bit terminal 59 because the lowest n+ line region only need to function as a sub-source line, which is selected by the source select unit. Additional bit lead and bit select transistor may be added to connect the bottom n+ line region 31 to the bit terminal 59 if a reverse current is required during operation, such as CHE injection as described above. The gate dielectric layer may be made of the same material as the charge-trapping layer or any suitable gate dielectric material, such as but not limited to silicon oxide, hafnium oxide, or any combination thereof.

Each of the p regions 60-63, which functions as the channel region for a bit select transistor, is coupled to one of the bit leads 52, 54, 56, and 58 at one end and to one of the n+ line regions 33, 35, 37, and 39 at the other end. The p regions 60-63 are spaced apart along the horizontal direction (y-direction) such that each of the p regions 60-63 interposes between a respective pair of bit select gates 64/64'-67/67'.

A potential Vd may be applied to an upper n+ line region such as the n+ line region 35 by applying a positive voltage Vbit to the bit terminal 59 and applying a positive voltage Vbg to the bit select line 69 and the paired bit select gates 65/65' coupled thereto to form two conductive channels on two sides of the p region 61 adjacent to the paired bit select gates 65/65'. Although the channels of the bit select transistor are open between the bit terminal 59 and the selected n+ line region 35, Vd at the n+ line region 35 will be lower than Vbit applied at the bit terminal 59 because of the inherent voltage drop across the bit select transistor.

Figure 6:
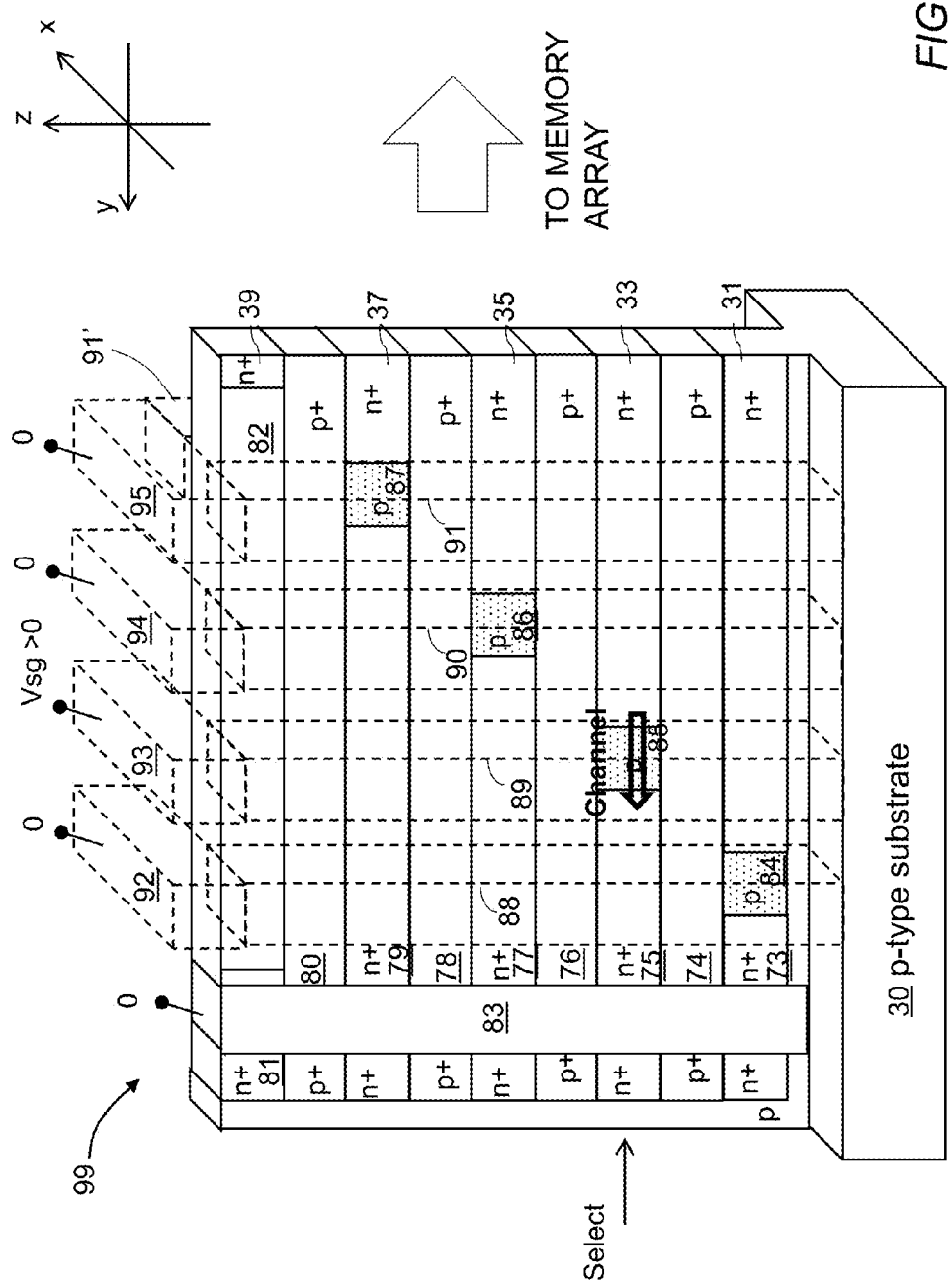
FIG. 6 is a perspective view of a source select unit in accordance with an embodiment of the present invention.

FIG. 6 illustrates an exemplary source select unit 99, which includes a source stud 83 and a plurality of horizontal source leads 73 75, 77, and 79 coupled thereto; and the horizontal n+ line regions 31, 33, 35, and 37 extending from the 2D array of memory cells 49 and connected to the source leads 73 75, 77, and 79 through a plurality of source select transistors controlled by a plurality of paired source select gates 88/88'-91/91' coupled to a plurality of source select lines 92-95. The source stud 83 is connected to a source line (not shown) above. For reasons of clarity, the source select gates 88/88'-91/91' and the source select lines 92-95 are made transparent in FIG. 6 to clearly illustrate the structure behind.

The source select unit 99 comprises a semiconductor block formed on the p-type substrate 30 with a plurality of horizontal n+ line regions 73 75, 77, and 79 functioned as source leads and interposed by a plurality of p+ line regions 74, 76, 78, and 80 functioned as field line regions along the vertical direction (z-direction). Like the source leads 73 75, 77, and 79, the field line regions 74, 76, 78, and 80 are also coupled to the source stud 83, which may be made of a metal or silicide that can electrically connect to a p-type or n-type region.

The source select unit 99 further includes a plurality of p regions 84-87 formed adjacent to the source leads 73 75, 77, and 79 and functioned as the channel regions for the source select transistors; the plurality of paired vertical source select gates 88/88'-91/91' formed adjacent to two opposite sides of the p regions 84-87 with a gate dielectric layer (not shown) interposed therebetween; the plurality of source select lines 92-95 formed above the semiconductor block with each one coupled to a respective pair of the paired source select gates 88/88'-91/91'; and the vertical source stud 83 couples to the source leads 73 75, 77, and 79 and the field line regions 74, 76, 78, and 80. The n+ line regions 31, 33, 35, and 37 extending from the 2D array of memory cells 49 are coupled to the p regions 84-87, respectively. The p line regions 32, 34, 36, and 38 extending from the 2D array of memory cells 49 are coupled to the p+ line regions 74, 76, 78, and 80, respectively. The n+ line region 39 may not be connected to a source lead or the source stud 83 because the highest n+ line region only need to function as a sub-bit line, which is selected by the bit select unit 72. Additional source lead and source select transistor may be added to connect the top n+ line region 39 to the source stud 83 if a reverse current is required during operation, such as CHE injection as described above. The gate dielectric layer may be made of the same material as the charge-trapping layer or any suitable gate dielectric material, such as but not limited to silicon oxide, hafnium oxide, or any combination thereof.

Each of the p regions 84-87, which functions as the channel region for a source select transistor, is coupled to one of the source leads 73 75, 77, and 79 at one end and to one of the n+ line regions 31, 33, 35, and 37 at the other end. The p regions 84-87 are spaced apart along the horizontal direction (y-direction) such that each of the p regions 84-87 interposes between a respective pair of source select gates 88/88'-91/91'.

A ground potential may be applied to the source stud 83 and the field line regions 74, 76, 78, and 80 and the p line regions 32, 34, 36, and 38 in the 2D array of memory cells 49 electrically connected thereto. A voltage Vs may be applied to a lower n+ line region such as the n+ line region 33 by applying a ground potential to the source stud 83 and applying a positive voltage Vsg to the source select line 93 and the paired source select gates 89/89' coupled thereto to form two conductive channels on two sides of the p region 85 adjacent to the paired source select gates 89/89'. Although the channels of the source select transistor are open between the source stud 83 and the selected n+ line region 33, Vs at the n+ line region 33 will be higher than the ground potential applied at the source stud 83 because of the inherent voltage change across the source select transistor.

Figure 7:
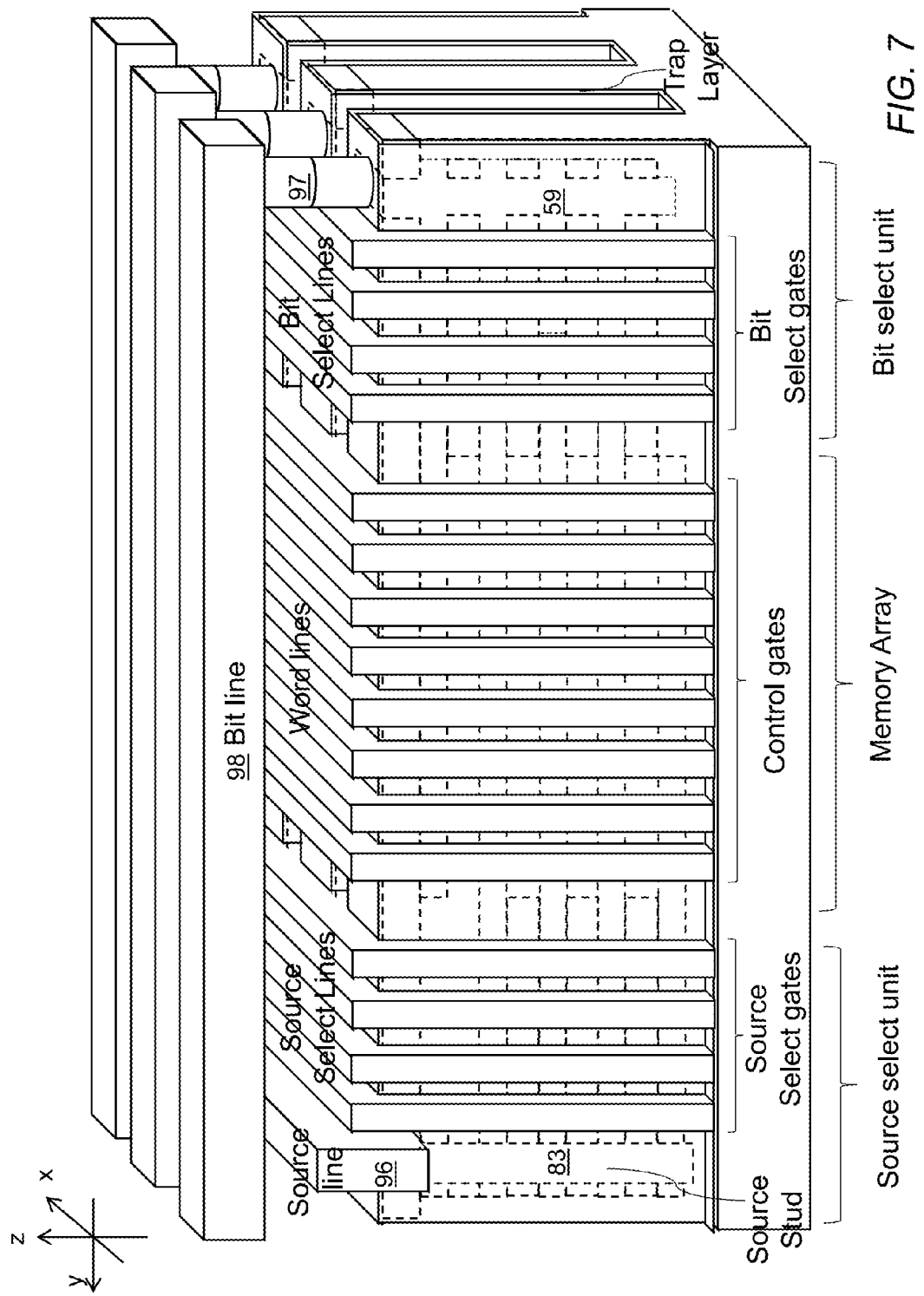
FIG. 7 is a perspective view of a three-dimensional memory device in accordance with an embodiment of the present invention.

FIG. 7 illustrates a three-dimensional memory device according to an embodiment of the present invention. The memory device includes a plurality of 2D memory blocks stacking along the x-direction with each memory block comprising a 2D array of memory cells 49 coupled to a bit select unit 72 and a source select unit 99 along the y-direction; a plurality of bit lines 98 formed above the memory blocks and extending along the y-direction with each of the bit lines 98 electrically connected to a respective bit terminal 59 of one of the memory blocks through a via stud 97; a plurality of bit select lines coupled to the bit select units 72 of the memory blocks along the x-direction as illustrated in FIG. 5; a plurality of word lines coupled to the 2D array of memory cells 49 of the memory blocks along the x-direction as shown in FIG. 4; a plurality of source select lines coupled to the source select units 99 of the memory blocks along the x-direction as illustrated in FIG. 6; and a source line 96 coupled to the source studs 83 of the memory blocks along the x-direction.

Figure 8:
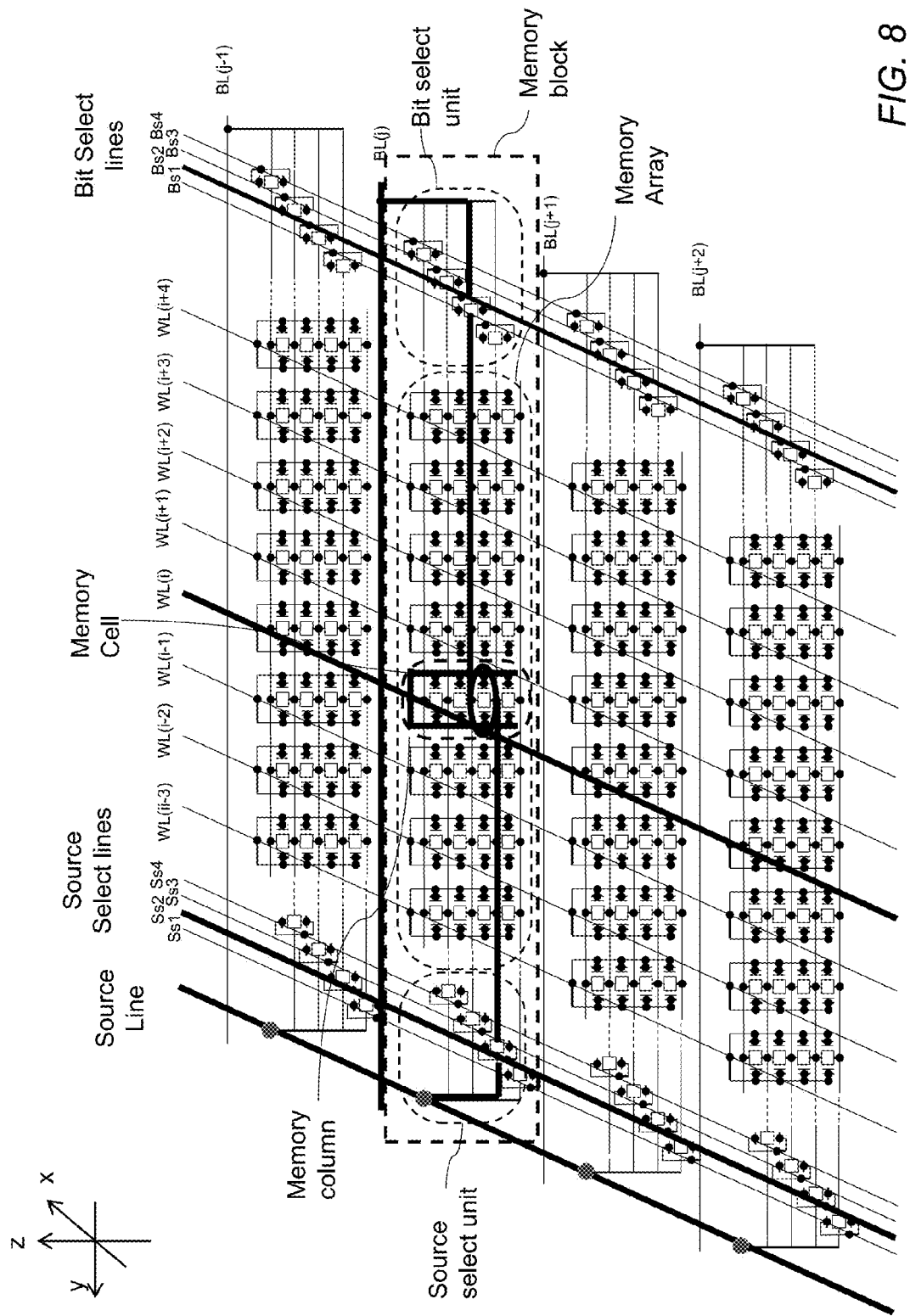
FIG. 8 is a schematic circuit diagram of the memory device of FIG. 7 in accordance with an embodiment of the present invention.

FIG. 8 is a schematic circuit diagram of the three-dimensional memory device of FIG. 7. The memory device includes a plurality of memory blocks stacked along the x-direction with each memory block including a 2D array of memory cells coupled to a bit select unit and a source select unit along the y-direction; a plurality of word lines (WL(i−1), WL(i), WL(i+1), . . . ) with each coupled to the 2D arrays of memory cells along the x-direction; a plurality of bit select lines (Bs1, Bs2, . . . ) with each coupled to the bit select units along the x-direction; a plurality of source select lines (Ss1, Ss2, . . . ) with each coupled to the source select units along the x-direction; a plurality of bit lines (BL(j−1), BL(j), BL(j+1), . . . ) extending along the y-direction with each coupled to a respective one of the bit select units; and a source line coupled to the source select units of the memory blocks along the x-direction.

With continuing reference to FIG. 8, each memory block includes a plurality of memory columns assembled along the y-direction. Each memory column further includes a plurality of memory cells stacked along the z-direction. Each memory cell includes a source and a drain with a channel region interposed therebetween, and a pair of control gates formed adjacent two opposite sides of the channel region with a charge-trapping layer serving as memory element interposed therebetween. Memory cells in a memory column share a common paired control gates, which are coupled to a word line. Memory columns along the x-direction in the memory device are coupled to a common word line. Within a memory block, drains or sources of memory cells having the same column level (in the z-direction) are coupled to a common sub-bit/source line.

Each of the bit select units includes a plurality of bit select transistors coupled to the sub-bit/source lines extending from the memory array at one end and to a bit terminal at the other end. Each bit terminal is connected to a respective one of the bit lines. Each sub-bit/source line is coupled to two parallel bit select transistors, the paired gates of which are coupled to a respective one of the bit select lines. Each of the source select units includes a plurality of source select transistors coupled to the sub-bit/source lines extending from the memory array at one end and to a source stud at the other end. The source studs of the source select units are coupled to a common source line, which is normally grounded. Each sub-bit/source line is coupled to two parallel source select transistors, the paired gates of which are coupled to a respective one of the source select lines.

Operation of the three-dimensional memory device will now be described with reference to FIG. 8. A memory cell is selected from a memory column by an appropriate bit select line and source select line. The memory column containing the selected memory cell is selected from a memory block by an appropriate word line. The memory block containing the memory column is selected from other memory blocks by a respective bit line connected thereto. For example, to select the memory cell circled in the Figure, appropriate voltages are applied to the bit line BL(j), the word line WL(i), the bit select line Bs2, and the source select line Ss2, while keeping the source line and other unselected lines grounded. The selected line paths are shown with thicker lines in the Figure.

Figure 9A:
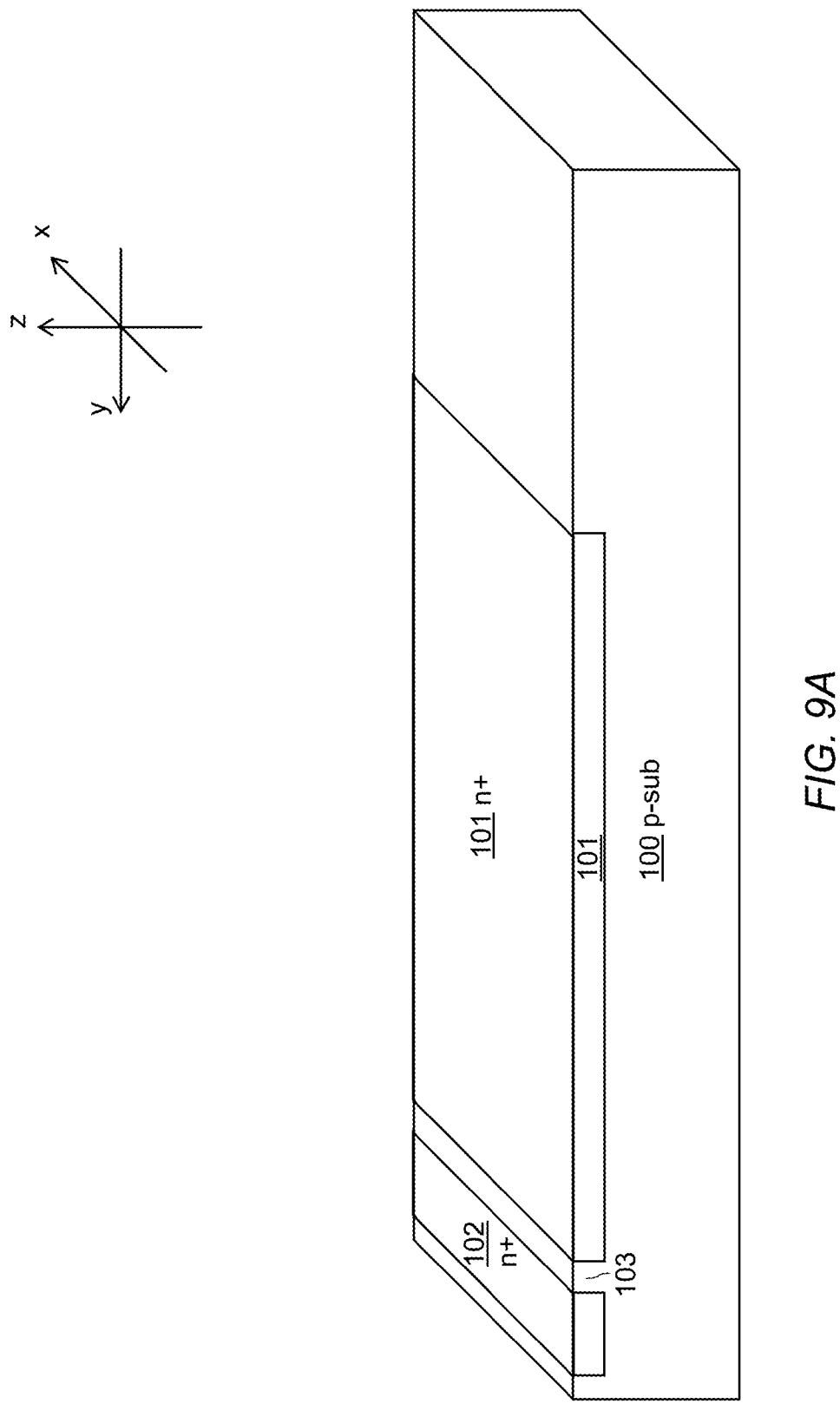
FIGS. 9A, 9B, and 10-15 are perspective views illustrate various intermediate structures in formation of a three-dimensional memory device in accordance with embodiments of the present invention.

An exemplary fabrication method for the memory device of FIG. 7 will now be described with reference to FIGS. 9A, 9B, and 10-15, which illustrate various intermediate structures of the memory device. Referring now to FIG. 9A, the processing starts by providing a p-type semiconductor substrate 100, which can be any semiconductor substrate known in the art, such as Si, SiGe, SiC, SiCGe, II-VI compounds, III-V compounds, or semiconducting epitaxial layers over such substrates. In one embodiment, the semiconductor substrate 100 is made of silicon. A first and second n+ layer regions 101 and 102 separated by a first p region 103 are formed on top of the substrate 100 by diffusion or ion implantation with n-type species. The first and second n+ layer regions 101 and 102 will be patterned later to form bottom source leads and bottom sub-source lines, respectively, while the first p region 103 will be patterned later to form the channel regions of source select transistors.

Figure 9B:
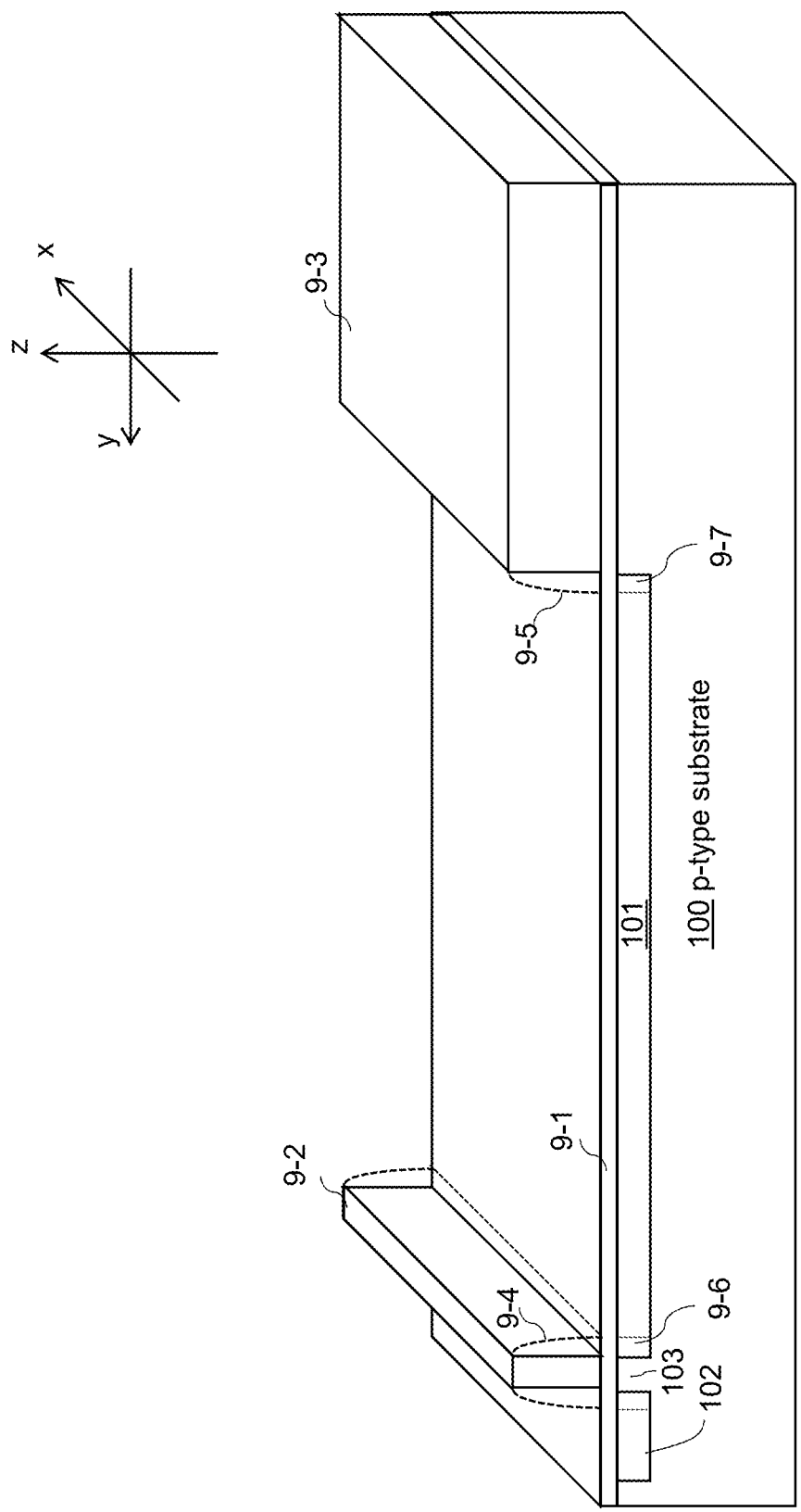

FIG. 9B illustrate an alternative approach for forming the first and second n+ layer regions 101 and 102 on top of the substrate 100. A sacrificial layer 9-1 is first deposited on top of the substrate 100. The substrate top is then implanted using low dose of n-type species with a first and second hard mask patterns 9-2 and 9-3 formed top of the sacrificial layer 9-1. Self-aligned spacers 9-4 and 9-5 are formed adjacent to the first and second hard mask patterns 9-2 and 9-3, respectively, prior to a second ion implantation using a high dose of n-type species, thereby creating LDD regions 9-6 and 9-7 at the edges the first and second n+ layer regions 101 and 102.

Figure 10:
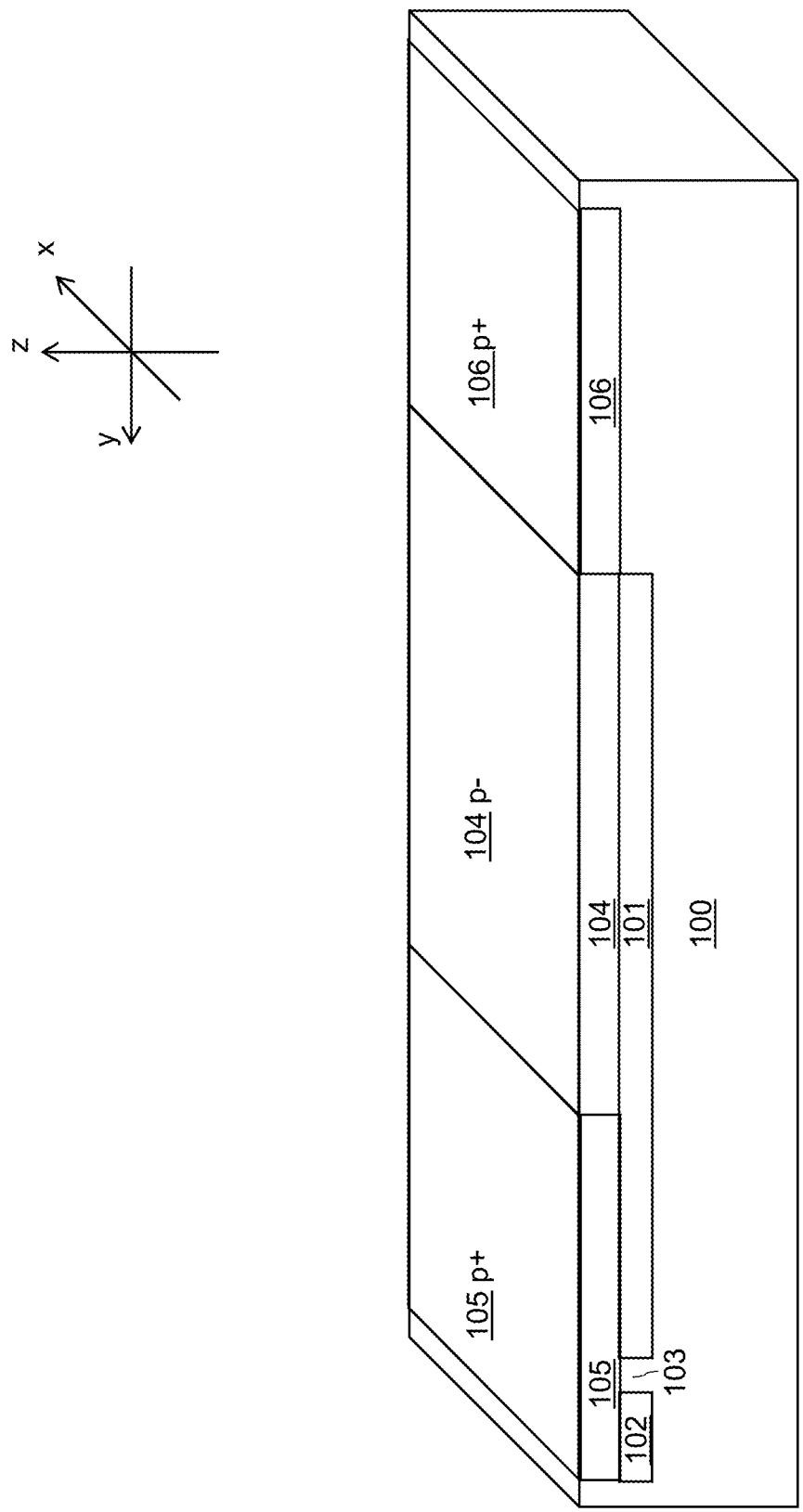

The processing continues by forming a p-type semiconductor layer on top by epitaxial growth or chemical vapor deposition (CVD) as illustrated in FIG. 10. The p-type layer comprises a second p layer region 104 on top of the first n+ layer region 101 and a first and second p+ layer regions 105 and 106 formed adjacent to the second p layer region 104. The second p layer region 104 will later be patterned to form p line regions that function as channel regions for memory cells. The first and second p+ layer regions 105 and 106 will become the field line regions of the source and bit select units, respectively. A higher dose of p-type species is implanted in the first and second p+ layer regions 105 and 106 to prevent the unintentional formation of conductive channels in the presence of applied potential to the bit and source select gates.

Figure 11:
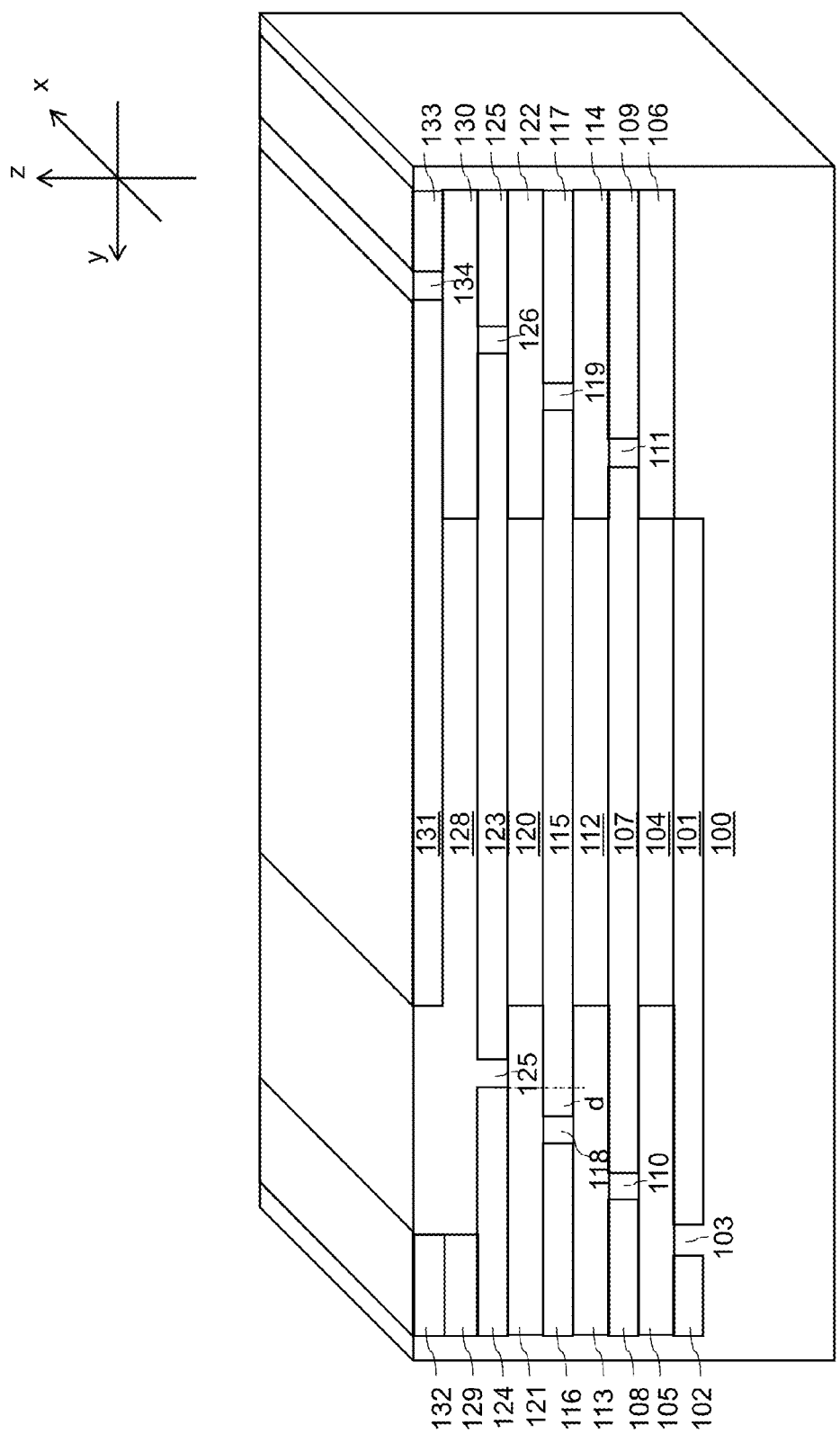

After formation of the p-type semiconductor layer, another semiconductor layer is formed thereon by epitaxial growth or CVD. The semiconductor layer comprises a third, fourth, and fifth n+ layer regions 107-109 separated by a third and fourth p regions 110 and 111 as illustrated in FIG. 11. The as-deposited semiconductor layer may be a p type and is then implanted with n-type species to form respective n+ layer regions 107-109. The third, fourth, and fifth n+ layer regions 107-109 will subsequently be patterned to form the source leads, the sub-bit/source lines, and the bit leads, respectively, while the third and fourth p regions 110 and 111 will be become the channel regions of source select transistors and bit select transistors, respectively.

With continuing reference to FIG. 11, the processing continues by repeatedly forming a p layer with two p+ regions separated by a p region as illustrated in FIG. 10 and a mostly n+ layer with three n+ regions separated by two p regions as described above in an alternate manner. The resulting stack structure comprises an n+ layer region 101 for sub-source lines, n+ layer regions 107, 115, and 123 for sub-bit/source lines, an n+ layer region 131 for sub-bit lines, n+ layer regions 102, 108, 116, and 124 for source leads, n+ layer regions 109, 117, 125, and 133 for bit leads, p layer regions 104, 112, 120, and 128 for memory channels, p regions 103, 110, 118, and 126 for channel regions of source select transistors, p regions 111, 119, 126, and 134 for channel regions of bit select transistors, p+ layer regions 105, 113, 121, and 129 for field lines of source select units, and p+ layer regions 106, 114, 122, and 130 for field lines of bit select units as illustrated in FIG. 11. The stack structure is terminated with a mostly n+ layer. The p regions 103, 110, 118, and 126 for channel regions of source select transistors may be stacked diagonally in the vertical direction (z-direction) such that the center-to-center spacing between two p regions in the horizontal direction (y-direction) is at least 2 F to ensure each vertical pair of source select gates is formed adjacent to only one of the p channel regions 103, 110, 118, and 126. Similarly, the p regions 111, 119, 126, and 134 for channel regions of bit select transistors are stacked in such a way that the center-to-center spacing between two p regions in the horizontal direction (y-direction) is at least 2 F. The p+ lines regions 105, 106, 113, 114, 121, 122, 129, and 130 for field lines of source and bit select units are doped to have higher concentrations of p-type species to prevent unintended formation of conductive channel and vertical sneak current between source leads or between bit leads.

Figure 12:
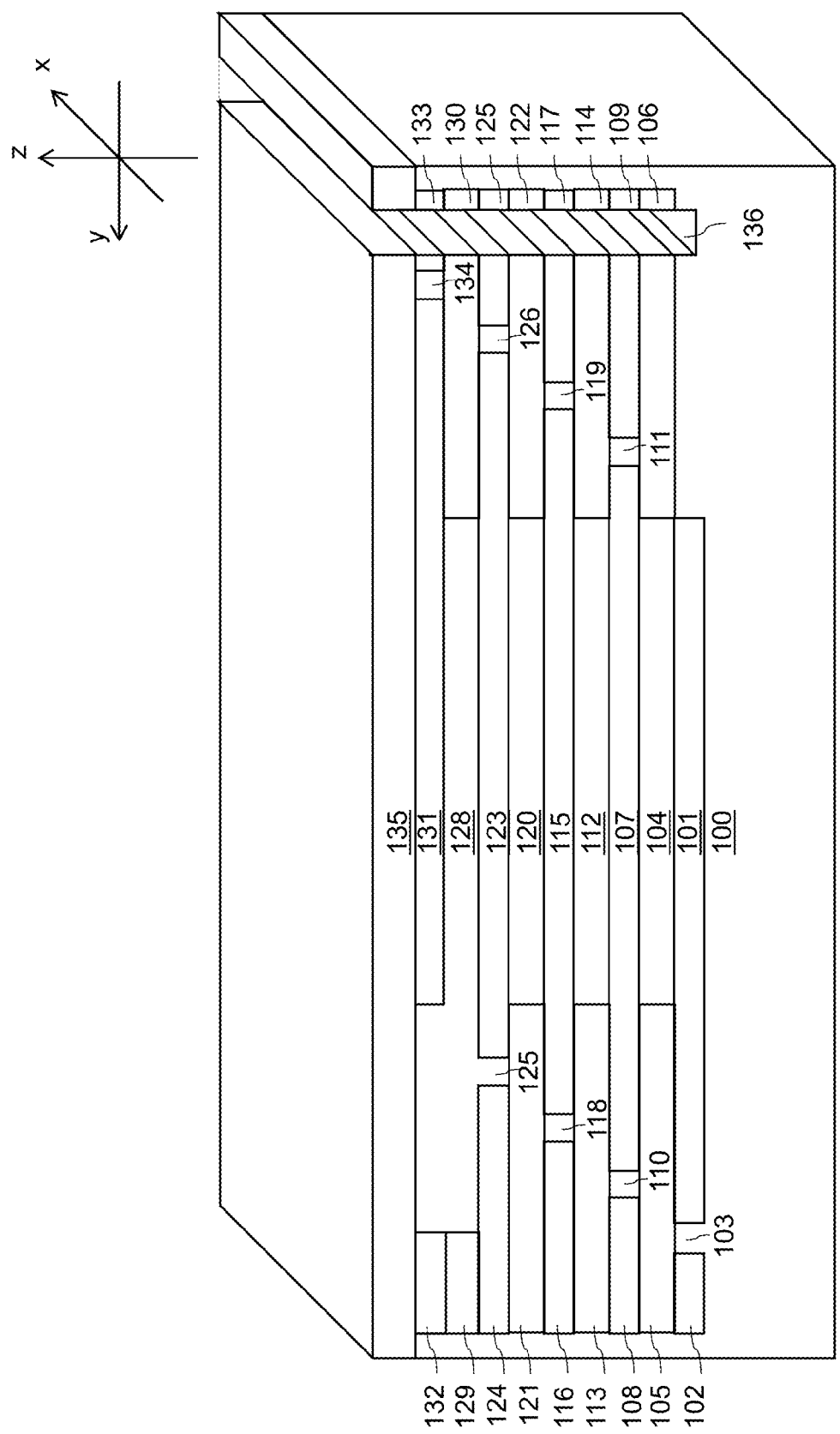
Figure 13:
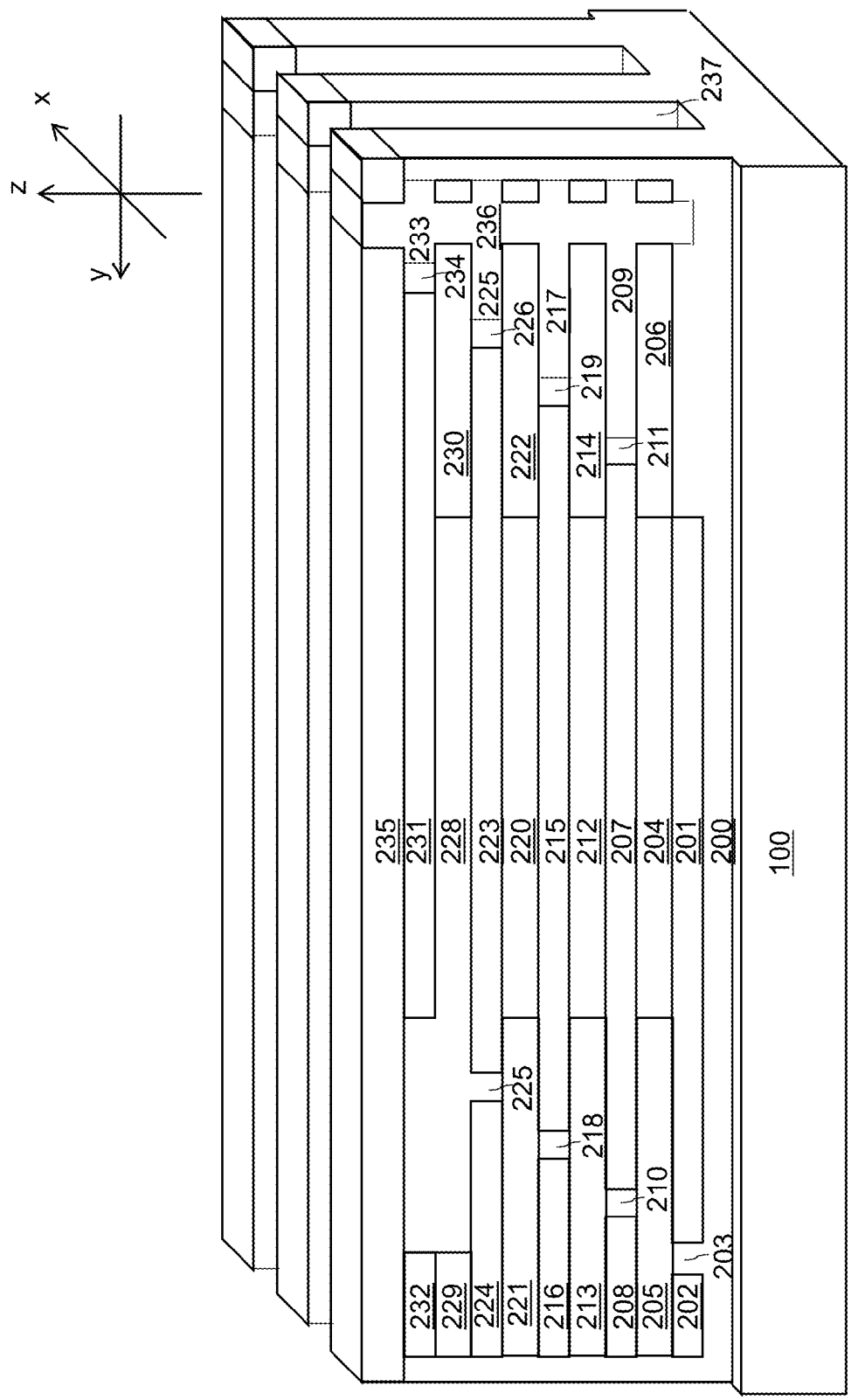

After the stack of alternating p/n layers are formed, a hard mask 135 is deposited thereon and then a trench 136 for forming bit terminals is etched into the stack at one side of the p regions 111, 119, 126, and 134 opposite the memory region along the horizontal direction (y-direction) as illustrated in FIG. 12. The trench 136 reaches the bottom bit lead layer 109 and extends along the x-direction.

The processing continues by filling the trench 136 with an n+ semiconducting material substantially identical to that of the n+ layer regions 109, 117, 125, and 133 for bit leads. The film stack of FIG. 12 with the trench 136 filled with the n+ semiconducting material is then etched into separate vertical wall structures extending along the horizontal direction (y-direction), resulting in the structure illustrated in FIG. 13. Each of the vertical wall structures corresponds to a memory block.

Therefore, the n+ layer region 101 becomes sub-source lines 201. The n+ layer regions 107, 115, and 123 become sub-bit/source lines 207, 215, and 223. The n+ layer region 131 becomes sub-bit lines 231. The n+ layer regions 102, 108, 116, and 124 become source leads 202, 208, 216, and 224. The n+ layer regions 109, 117, 125, and 133 become bit leads 209, 217, 225, and 233. The p layer regions 104, 112, 120, and 128 become memory channel regions 204, 212, 220, and 228. The p regions 103, 110, 118, and 126 become channel regions 203, 210, 218, and 226 of source select transistors. The p regions 111, 119, 126, and 134 become channel regions 211, 219, 226, and 234 of bit select transistors. The p+ layer regions 105, 113, 121, and 129 become field lines 205, 213, 221, and 229 of source select units. The p+ layer regions 106, 114, 122, and 130 become field lines 206, 214, 222, and 230 of bit select units.

Figure 14:
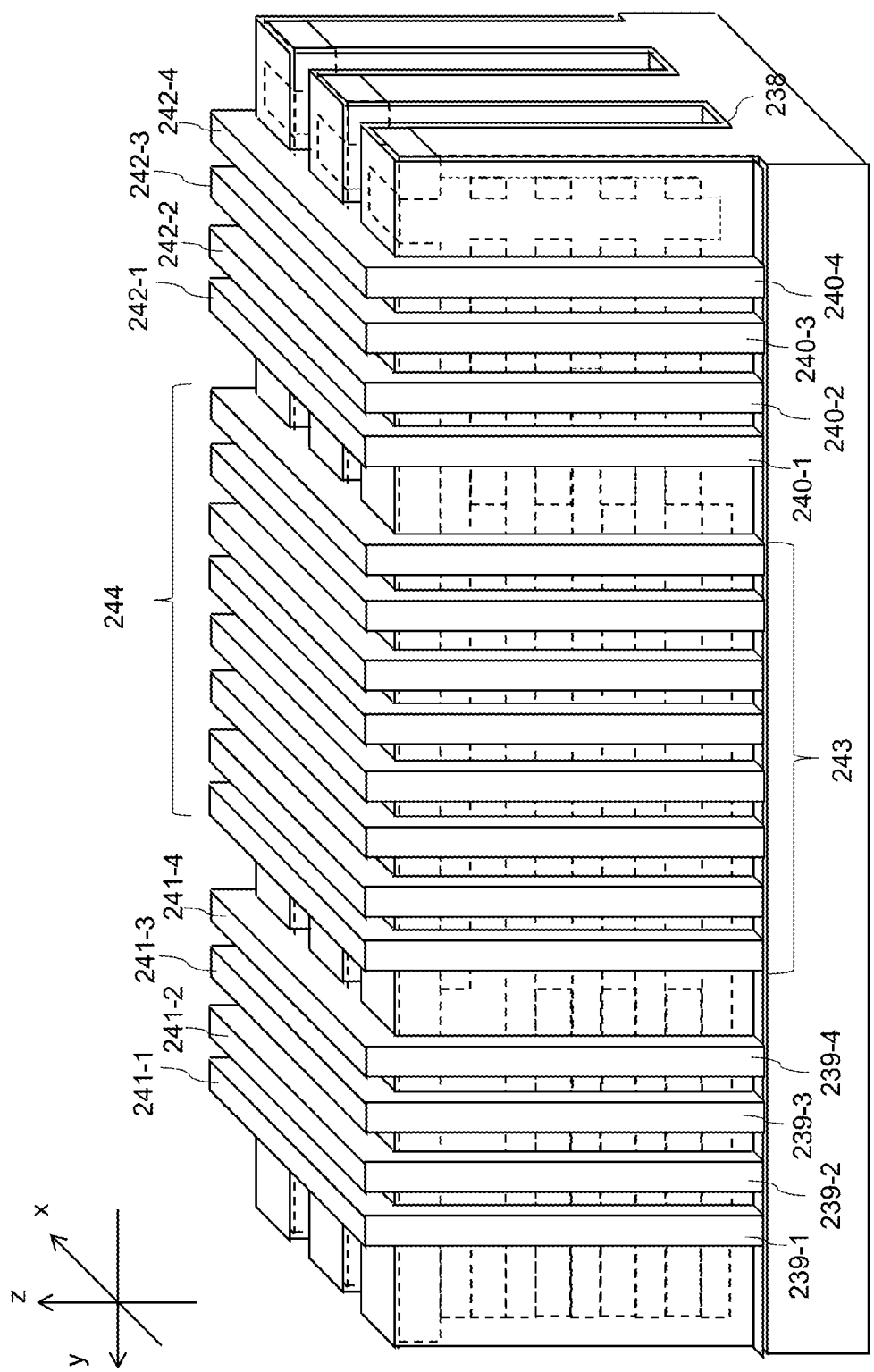

The processing continues by conformally depositing a charge-trapping layer 238 on the surface of the vertical wall structures, including sidewalls thereof, and then forming source select gates 239-1 to 239-4 and lines 241-1 to 241-4, control gates 243, word lines 244, and bit select gates 240-1 to 240-4 and lines 242-1 to 242-4, resulting in the structure illustrated in FIG. 14. The charge-trapping layer 238 serves as memory elements when patterned and can be made of any suitable layer stack, such as but not limited to silicon oxide/silicon nitride/silicon oxide (ONO) or aluminum oxide/silicon nitride/silicon oxide (ANO). The gates and lines 239 to 244 are formed by first depositing an electrode material on top of the vertical wall structures and filling the trenches or gaps 237 between the vertical wall structures. The electrode material is then planarized and patterned to form a plurality of parallel plate-shaped electrodes, surfaces of which are perpendicular to the horizontal direction (y-direction). The patterning process may be carried out by vertical dry etching. Each plate-shaped electrode is perforated by the vertical wall structures extending along the horizontal direction (y-direction) with the portion above the vertical wall structures functions as a word line, source select line, or bit select line, and the portions between the vertical wall structures function as control gates, source select gates, or bit select gates.

With continuing reference to FIG. 14, a row of memory columns along the x-direction may be selected by applying a gate potential to a respective plate-shaped electrode comprising one of the word lines 244 and a respective row of the control gates 243 coupled thereto. A row of memory cells along the x-direction can be further selected from the row of memory columns by applying appropriate potentials to a respective one of the source select lines 241-1 to 241-4 and to a respective one of the bit select lines 242-1 to 242-4. For example, to select the a row of memory cells along the x-direction comprising the first memory cell, as counted from the bottom, of each memory column of the selected row of memory columns along the x-direction, a source select voltage and a bit select voltage are applied to the source select line 241-1 and the bit select line 242-1. Similarly, a row of memory cells along the x-direction comprising the ith memory cell of each respective memory column may be selected by applying appropriate potentials to the source select line 241-$i$ and the bit select line 242-$i$.

Figure 15:
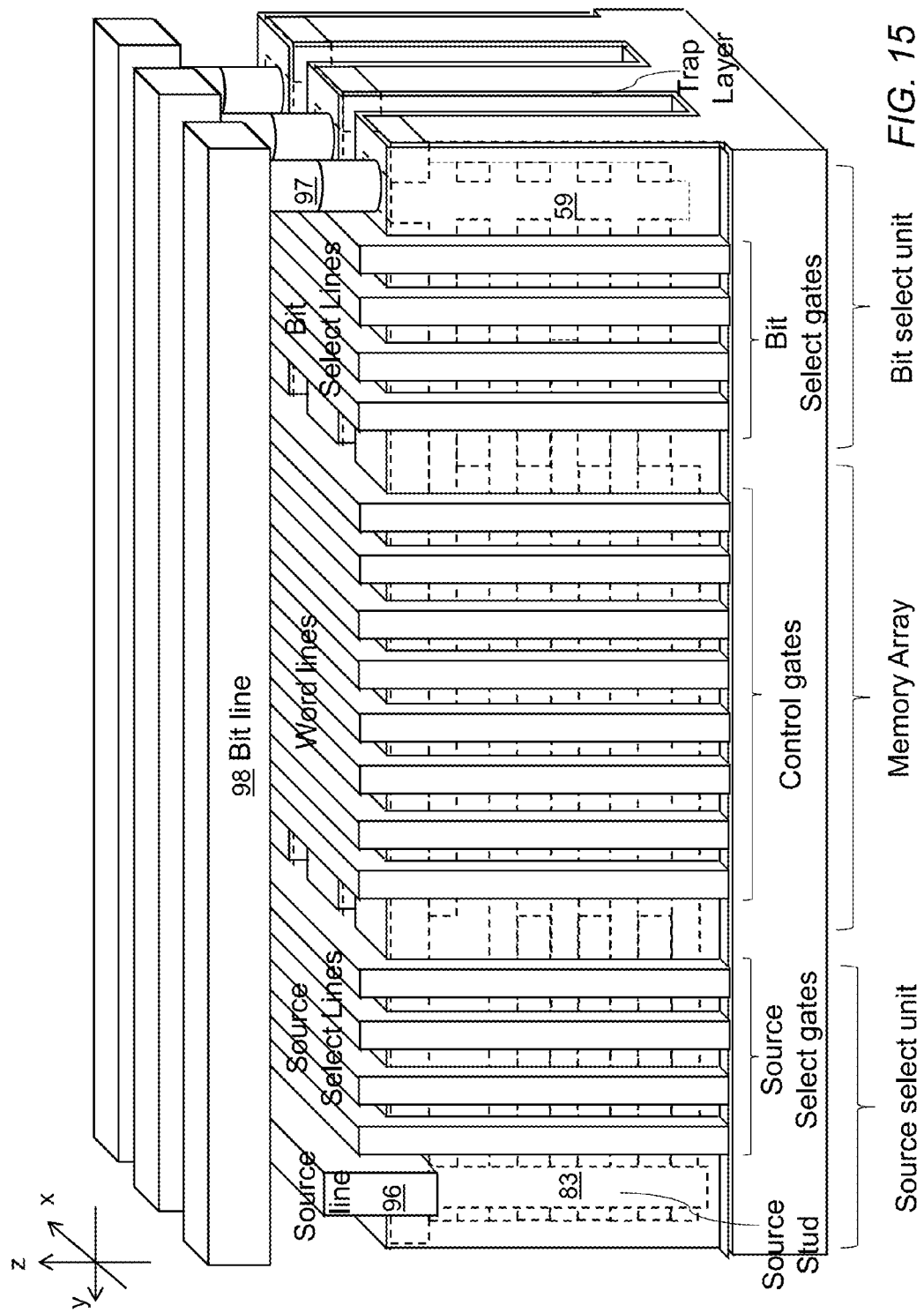

After formation of the gate lines and electrodes, an interlayer dielectric (not shown) surrounding the structure of FIG. 14, the source studs 83 and the common source line 96 coupled thereto along the x-direction, and the via studs 97 and the bit lines 98 coupled thereto are formed to complete the memory device as illustrated in FIG. 15. The interlayer dielectric (not shown) is formed by first depositing a dielectric material over the structure of FIG. 14, including the trenches 237 between the vertical wall structures, and then planarizing the dielectric material. A vertical hole reaching the bottom source lead 202 is etched near the edge of each source select unit. The vertical hole is then filled with a metallic material to form the source stud 83, which provides ground potential to the source leads 202, 208, 216, and 224 with the n+ type conductivity and the field lines 205, 213, 221, and 229 with the p+ type conductivity. A source line 96, which is normally grounded during operation, is coupled to the underlying source studs 83 along the x-direction and may be formed by a Damascene process. The via studs 97 may form on top of the bit terminals 59 by a Damascene process. The bit lines 98, which extend along the horizontal direction (y-direction) with each coupling to a respective one of the underlying via studs 97, may be formed by a Damascene process and may be made of a suitable metallic material, such as but not limited to copper, tungsten, tantalum, or aluminum.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A semiconductor memory device comprising:
   a plurality of parallel semiconductor blocks separated along a first direction on a p-type semiconductor substrate, each of said semiconductor blocks having i number of n-type line regions extending along a second direction separated by i–1 number of p-type line regions along a third direction;
   a plurality of first plate electrodes separated along said second direction, each of said first plate electrodes being perforated by said semiconductor blocks extending along said second direction; and
   a charge-trapping layer formed between said semiconductor blocks and said plate electrodes,
   wherein i is an integer greater than or equal to two; said first, second, and third directions are orthogonal to each other.

2. The semiconductor memory device of claim 1, wherein said third direction is substantially orthogonal to surface of said p-type semiconductor substrate.

3. The semiconductor memory device of claim 1, wherein each of said first plate electrodes being perforated by said semiconductor blocks has a portion formed above said semiconductor blocks that functions as a word line and portions formed between said semiconductor blocks that function as control gates.

4. The semiconductor memory device of claim 1, wherein said n-type line regions function as sub-bit lines or sub-source lines or both.

5. The semiconductor memory device of claim 1, wherein said p-type line regions function as channel lines that allow current to flow along said third direction between two n-type line regions adjacent thereto.

6. The semiconductor memory device of claim 1, wherein said charge-trapping layer has a multilayer structure comprising silicon oxide/silicon nitride/silicon oxide (ONO) or aluminum oxide/silicon nitride/silicon oxide (ANO).

7. The semiconductor memory device of claim 1, further including a plurality of bit select units with each of said bit select units comprising:
- a bit terminal extending along said third direction;
- i or i−1 number of bit leads coupled to said bit terminal; and
- i or i−1 number of parallel pairs of bit select transistors, each pair of said bit select transistors being coupled to one of said n-type line regions at one end and one of said bit leads at the other end,
- wherein each pair of said bit select transistors including a paired gate electrodes extending along said third direction and coupled to a bit select line extending along said first direction.

8. The semiconductor memory device of claim 1, further including a plurality of source select units with each of said source select units comprising:
- a source stud extending along said third direction;
- i or i−1 number of source leads coupled to said source stud; and
- i or i−1 number of parallel pairs of source select transistors, each pair of said source select transistors being coupled to one of said n-type line regions at one end and one of said source leads at the other end,
- wherein each pair of said source select transistors includes a paired gate electrodes extending along said third direction and coupled to a source select line extending along said first direction.

* * * * *